United States Patent [19]
Kawai et al.

[11] Patent Number: 5,926,432
[45] Date of Patent: Jul. 20, 1999

[54] SEMICONDUCTOR STORAGE DEVICE HAVING A HIERARCHICAL BIT LINE STRUCTURE

[75] Inventors: Tomoyuki Kawai, Tenri; Toshihiko Yoshinari; Koji Komatsu, both of Nara, all of Japan

[73] Assignee: Sharp Kabushiki Kaisha, Osaka, Japan

[21] Appl. No.: 09/014,528

[22] Filed: Jan. 28, 1998

[30] Foreign Application Priority Data

Feb. 6, 1997 [JP] Japan ................................ 9-023659

[51] Int. Cl.⁶ ................................................ G11C 8/00
[52] U.S. Cl. .................... 365/230.03; 365/63; 365/238.5
[58] Field of Search ........................ 365/63, 72, 230.03, 365/230.06, 221, 238.5

[56] References Cited

U.S. PATENT DOCUMENTS

| | | | |
|---|---|---|---|
| 5,467,300 | 11/1995 | Komarek et al. | 365/94 |
| 5,587,959 | 12/1996 | Tsukude | 365/230.06 |
| 5,715,189 | 2/1998 | Asakura | 365/72 |
| 5,864,497 | 1/1999 | Suh | 365/72 |

FOREIGN PATENT DOCUMENTS

| | | |
|---|---|---|
| A-59-65995 | 4/1984 | Japan . |
| A-63-160094 | 7/1988 | Japan . |
| A-1-128293 | 5/1989 | Japan . |
| A-4-311900 | 11/1992 | Japan . |

*Primary Examiner*—Son Mai
*Attorney, Agent, or Firm*—Morrison & Foerster, LLP

[57] ABSTRACT

Word lines are driven by respective word line driving circuits in a row selector. Bank selection line driving circuits for driving respective bank selection lines of memory cell arrays are arranged on one side of the first memory cell array and between the adjacent memory cell arrays. The bank selection line driving circuits corresponding to the respective memory cell arrays are connected in series from a row selector side. The bank selection line driving circuits drive the bank selection lines of the corresponding memory cell arrays respectively.

7 Claims, 10 Drawing Sheets

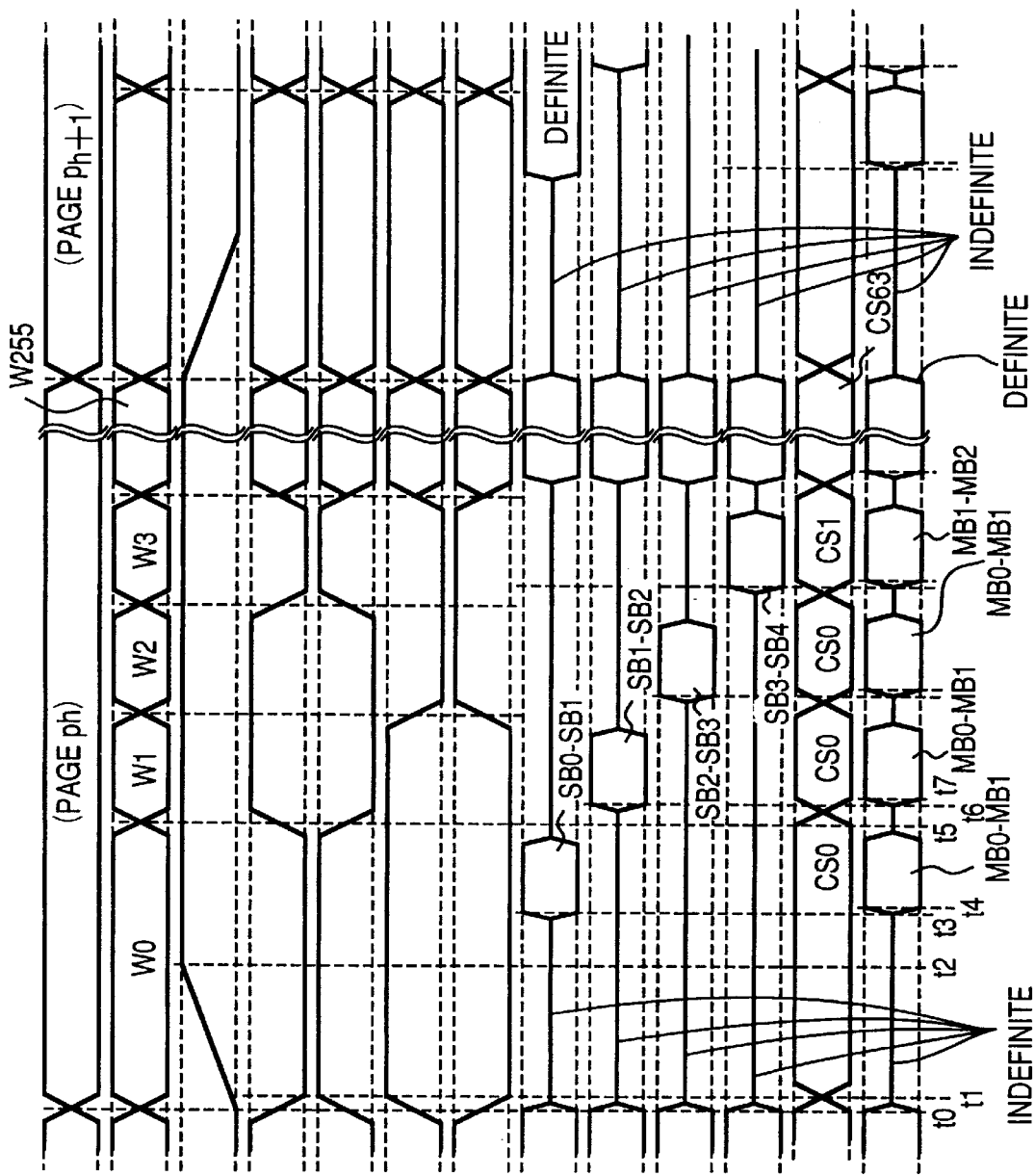

SEMICONDUCTOR STORAGE DEVICE HAVING A HIERARCHICAL BIT LINE STRUCTURE

BACKGROUND OF THE INVENTION

The present invention relates to a semiconductor storage device employing a hierarchical bit lining method and executing a serial access to memory cells connected with the same word line.

Existing semiconductor storage devices having a large capacity to be used in an image data-processing field include those which operate under a so-called serial access mode, i.e., execute a serial access to memory cells connected with the same word line.

FIG. 6 is a block diagram showing the construction of a conventional read-only semiconductor storage device (ROM: read-only memory) executing a serial access operation. The semiconductor storage device has a 16-megabit storage capacity; an input address is of 20 bits (A0–A19) and output data is of 16 bits (D0–D15).

As shown in FIG. 6, the semiconductor storage device has memory cell arrays MA0, ..., MAm, ... arranged in a row direction, each memory cell array consisting of memory cells M arranged in a matrix shape. The semiconductor storage device further has a row decoder RD for outputting a row selection signal Sr upon receipt of a row address signal (A8–A19) through an address buffer Abuf1, and a row selector X-S5 for selecting one word line from a plurality of word lines WLi (i=0–4095) upon receipt of the row selection signal Sr from the row decoder RD. The semiconductor storage device further has a column decoder CD for outputting a column selection signal Sc upon receipt of a column address signal (A0–A7) through an address buffer Abuf2, and a plurality of column selectors Y-S2 each for selecting one bit line from a plurality of bit lines MB0–MB255 of the associated memory cell array MA0, ..., MAm, ... upon receipt of the column selection signal Sc from the column decoder CD. Sense amplifiers SA0, ..., SAm, ... for detecting information of each memory cell M are connected with the column selectors Y-S2, respectively. Detection signals DS0, ..., DSm, ... of the respective sense amplifiers SA0, ..., SAm, ... are transmitted to output circuits Obuf0, ..., Obufm, ..., and output as signals D0, ..., Dm, ....

Supposing that memory cells selected by one word line WLi constitute a page and that a plurality of bits within one page which can be accessed simultaneously constitute a word, one page consists of 256 words specified by the column address (A0–A7) in the input addresses (A0–A19).

The serial access operation of the semiconductor storage device is described below with reference to a timing chart shown in FIG. 7.

After the level of each bit of the address signal (A0–A19) becomes definite at a time t10, the row decoder RD outputs the row selection signal Sr corresponding to a page (Ph) to the row selector X-S5, upon receipt of the row address signal (A8–A19) shown in FIG. 7 (a) from the address buffer Abuf1. Upon receipt of the row selection signal Sr from the row decoder RD, the row selector X-S5 selects one word line WLi. As a result, the level of the word line signal of the word line WLi becomes "High" slowly (in FIG. 7 (c)). At a time t11, data DmBk (m=0–15, k=0–255) of a bit line MBj of each of the memory cell arrays MA0, ..., MAm, ... becomes definite (FIG. 7 (d)). Before the time t11, upon receipt of the column address signal (A0–A7) (shown in FIG. 7(b)) through the address buffer Abuf2, the column decoder CD outputs the column selection signal Sc to the column selectors Y-S2 (FIG. 7 (e)).

Upon receipt of the column selection signal Sc from the column decoder CD, each column selector Y-S2 selects one bit line from among the bit lines MB0–MB255 of each of the memory cell arrays MA0, ..., MAm, .... As a result, at a time t12, the level of each of the output signals D0, ..., Dm, ... of word data Wo corresponding to the column address signal (A0–A7) becomes definite (FIG. 7 (f)). Then, the column selection signal changes in level in consequence of the change in level of only the column address signal (A0–A7) at a time T13. As a result, the levels of the output signals DO, ..., Dm, ... of word data W1 promptly become definite at a time t14 because one word line has been already selected from among the word lines WLi.

With the change of the value of the column address signal (A0–A7) from 0 to 255, the data DmBk (m=0–15, k=0–255) of one page (Ph), namely, word data W0–W255 are serially read. When the page changes from (Ph) to a subsequent one (Ph+1), the current word line WLi is changed to another one WLi. In a similar manner, word data W0–W255 are serially read.

In the reading operation of the semiconductor storage device having the serial access mode, a plurality of memory cells of each of the memory cell arrays MA0, ..., MAm, ... are simultaneously selected according to the column address signal (A0–A7) and the row address signal (A8–A19). Then, when the plurality of data are read as the page data by the sense amplifiers SA0, ..., SAm, ..., the levels of each bit of the column address signal (A0–A7) are changed so that the data DmBk (m=0–15, k=0–255) of the selected memory cells are switched at a high speed and output serially. When changing the row address signal (A8–A19), it takes a long time for output data to become definite because it takes a long time to change the word line s WLi. On the other hand, when changing only the column address signal (A0–A7), a high-speed reading operation is executed in the serial access mode because only the time for the column decoder RD2 to switch one column selection signal to another and the response time of the sense amplifiers SA0, ..., SAm, ... are necessary.

There is known a semiconductor storage device employing a so-called hierarchical bit lining method in which bit lines are composed of main bit lines and sub-bit lines in a hierarchical structure so that the semiconductor storage device has a high density (Laid-Open Japanese Patent Publication No. 4-311900). It is also known to apply the hierarchical bit lining method to a semiconductor storage device which executes the serial access operation.

FIGS. 8 and 9 show an example of a hierarchical bit lining semiconductor storage device operable in the serial access mnode. FIG. 8 shows a circuit of one block of a memory cell array of the semiconductor storage device. Parts shown in FIGS. 8 and 9 similar to those in FIG. 6 are denoted by the same reference numerals as those of FIG. 6. In the semiconductor storage device, sources or drains of a plurality of memory cells Mxy arranged in a column direction are connected with sub-bit lines SB0, SB1, .... As shown in FIG. 8, each two of the alternate sub-bit lines SB0, SB2, ... starting from the first one on the left-hand side of the figure are connected with each of the alternate main bit lines MB0, MB2, ... starting from the first one, through bank selection transistors TB00, TB10, .... Similarly, each two of the other alternate sub-bit lines SB1, SB3, ... starting from the second on the left-hand side of the figure are connected with each of the other alternate main bit lines MB1, MB3, ... through bank selection transistors TB20, TB30, .... A bank selection line BS0 connected with the gate of each of the bank selection transistors TB00, TB01, ... is parallel with word lines WLi, and a bank selection line BS1 connected with the gate of each of the bank selection transistors TB10, TB11, ... is also parallel with the word lines WLi. A bank selection line BS2 connected with the gate of each of the bank selection transistors TB20, TB21, ... is parallel with the word lines WLi, and a bank selection line BS3 connected with the gate of each of the bank selection transistors TB30, TB31, ... is also parallel with the word lines WLi.

As shown in FIG. 9, each of memory cell arrays MA0, ..., MAm, ..., MA15 is composed of a plurality of blocks 0–255 (each of which is constructed as shown in FIG. 8) arranged in a column direction. The memory cells of the blocks 0–255 in the same columns are connected with the common main bit lines MB0, MB1, ... extending in the column direction through the common sub-bit lines SB0, SB1, ... and the bank selection transistors TB00, TB10, .... The main bit lines MB0, MB1, ... are connected with associated column selectors Y-S9.

The hierarchical bit lining semiconductor storage device operates in the serial access mode as follows: In selecting a memory cell M1 from among memory cells M0, M1, M2, and M3 connected with the word line WL1, for example, input of an address makes the row selector X-S9 select one word line WLi. As a result, the level of the word line signal of the word line WLi becomes "High", and the level of the bank selection signal of each of the bank selection lines BS0 and BS2 becomes "High". In this manner, the memory cells M0, M1, ... whose gates are connected with the word line WL1 are selected, and the bank selection transistors TB00 and TB20 are turned on to thereby connect the sub-bit lines SB1 and SB2 with the main bit lines MB1 and MB0, respectively. As a result, the memory cell M1 whose source and drain are connected with the sub-bit lines SB1 and SB2 is selected. Then, based on the inputted address, the level of the column selection signal of the column selection line CS0 is turned "High" by the operation of the column selector Y-S9, and a column selection transistor TR0 in the column selector Y-S9 is turned on. When the column selection transistor TR0 is turned on, the memory cell M1 is connected with a sense amplifier (not shown) through the sub-bit line SB2 and the main bit line MB0. Because the main bit line MB1 is connected with the ground potential serving as a reference potential, a signal DC0 indicating the information of the memory cell M1 is input to the sense amplifier. In a similar manner, a memory cell M1 of each of the remaining memory cell arrays MA2, ..., MAm, ..., MA15 is selected, and signals DC2, ..., DCm, ..., DC15 each indicating the information of the memory cell M1 of each of the memory cell arrays MA2, ..., MAm, ..., MA15 is input to the respective sense amplifiers (not shown).

In the semiconductor storage device employing the hierarchical bit lining method and executing the serial access operation, the number of times of switching the bank selection lines BS0–BS3 is considerably larger than that of the word lines WLi. Thus the average access time depends on the transition time (ie, a time required for the change from an active state to an inactive state and vice versa) of the bank selection line signals of the bank selection lines BS0–BS3. Therefore, when increasing the number of serially accessible memory cells, ie, memory cells whose data can be serially read by the serial access mode operation of the semiconductor storage device, a load is increasingly applied to the circuit for driving the bank selection lines BS0–BS3. As a result, the transition time of the bank selection line signals of the bank selection lines BS0–BS3 increases, which makes the average access time longer accordingly.

SUMMARY OF THE INVENTION

It is an object of the present invention to provide a semiconductor storage device capable of allowing an average access time to be short and yet allowing an increase of the area of a chip being suppressed even though the number of serially accessible memory cells is increased.

A semiconductor storage device in accordance with an aspect of the present invention has one or more memory cell arrays each consisting of a plurality of memory cells arranged in a matrix shape; a plurality of word lines extending in a direction of rows of the one or each memory cell array and connected with the memory cells in each row; a plurality of main bit lines and sub-bit lines in a hierarchical structure which extend in a direction of columns of the one or each memory cell array, wherein the memory cells in columns are connected with the sub-bit lines and each sub-bit line is connected with one of the main bit lines such that the memory cells in columns are connected with the main bit lines through the sub-bit lines; column selection means connected with the main bit lines in the one or each memory cell array for sequentially selecting the main bit lines; a plurality of bank selection lines for selecting the sub-bit lines connected with the sequentially selected main bit lines, the bank selection lines extending parallel with the word lines; word line driving means for outputting a word line signal to drive the word lines; and bank selection line driving means for outputting a bank selection line signal to drive the bank selection lines. One of the word lines is selected by the word line signal output from the word line driving means, and the memory cells connected with the selected word line are serially accessed in the one or each memory cell array through sequential selection, by the bank selection line signal output from the bank selection line driving means, of the sub-bit lines connected with the sequentially selected main bit lines in the one or each memory cell arrays. A transition time of the bank selection line signal output from the bank selection line driving means is shorter than that of the word line signal output from the word line driving means.

The term "bank" use d in the specification refers to a column of memory cells arranged between adjacent sub bit lines.

With the above construction, when the device operates under the serial access mode in which the memory cells connected with the selected one word line are successively accessed by switching the bank selection signal, the bank selection signal is switched at a high speed because the transition time of the bank selection line signal is shorter than that of the word line signal. As a result, a serial access to the memory cells connected with the same word line is achieved at a high speed. In addition, the number of the bank selection lines is considerably smaller than that of the word lines. Accordingly, even though the number of serially accessible memory cells is increased, it is possible to allow the average access time to be short while suppressing the increase of the area of the chip.

In an embodiment, the memory cell arrays are arranged in the row direction, and the bank selection line driving means are provided in one-to-one correspondence with the respective memory cell arrays.

In this embodiment, due to the provision of the bank selection line driving means for the respective memory cell arrays in one-to-one correspondence, a load applied to the bank selection line driving means is allowed to be small. Therefore, the transition time of the bank selection line signal output from the bank selection line driving means is allowed to be shorter than that of the word line signal of the word line driving means. In this case, even when the number of the memory cell arrays is increased and the number of the bank selection line driving means is therefore increased, it is possible to suppress the increase of the area of chip to a minimum because the number of the bank selection lines is considerably smaller than that of the word lines.

In an embodiment, the bank selection line driving means and the bank selection lines of the memory cell arrays are connected in series.

This construction is achieved only by placing the bank selection line driving means on one side of one of the end memory cell arrays and between the adjacent memory cell arrays without increasing the number of the bank selection lines. Accordingly, although a plurality of the bank selection line driving means are used, the increase of the area of the chip is especially suppressed. In this embodiment, the change of the level of the bank selection line signal does not take place at the same time for all the memory cell arrays, but delays in accordance with the order of arrangement of the memory cell arrays. Influence of this delay on output data is eliminated by arranging the memory cell arrays in an order in which bits of the output data are serially transferred. On the other hand, the above delay of the change of the bank selection line signal prevents an instantaneous electric current from simultaneously flowing through the bank selection line driving means for each memory cell array, which in turn reduces a peak value of the instantaneous electric current during the operation under the serial access mode. As a result, the semiconductor storage device stably performs the access operation.

In an embodiment, the device further has second bank selection line driving means whose output terminal is connected with input terminals of the bank selection line driving means for the respective memory cell arrays.

According to the construction, the bank selection line driving means for the respective memory cell arrays simultaneously drive the associated bank selection lines based on the output from the second bank selection line driving means. Thus, there is no delay of the bank selection line signal as described above.

In an embodiment, an out put of the bank selection line driving means has a polarity inverse to that of an input thereof, and an output of the second bank selection line driving means also has a polarity inverse to that of an input thereof.

According to the construction, the bank selection line driving means for each bank selection line and the second bank selection line driving means can be composed of a onestage inverter. Therefore, it is possible to form them on the chip at a small percentage of the entire chip area.

In an embodiment, when the device has the plural memory cell arrays, these memory cell arrays share each bank selection line, and wherein said bank selection line driving means is provided on both sides of said one or more memory cell arrays such that both ends of each bank selection line are connected with an output terminal of each bank selection line driving means.

According to this construction, each bank selection line is driven from both ends simultaneously by the bank selection line driving means connected with the respective ends of the bank selection line. Thus, the transition time of the bank selection line signal output from the bank selection line driving means is allowed to be shorter than that of the word line signal of the word line driving means. Even though the total area, or total planar dimensions of the bank selection line driving means is increased because of the provision of the bank selection line driving means on both sides of the one or more memory cell arrays, the increase of the area of the chip is suppressed as much as possible because the number of the bank selection lines is considerably smaller than that of the word lines. Further, in the case that the plurality of memory cell arrays are provided, because the bank selection line driving means can be positioned outside the memory cell arrays, it is unnecessary to form a gap or space between the adjacent memory cell arrays. This avoids the increase of the area of each memory cell array itself. Therefore, it is easy to accomplish an efficient arrangement of parts on a semiconductor substrate.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2 is a timing chart showing a serial access operation of the semiconductor storage device of the first embodiment;

DETAILED DESCRIPTION OF THE PREFERRED EMBODIMENTS

The semiconductor storage device of the present invention will be described below in detail with reference to the drawings.

First Embodiment

Figure 1:
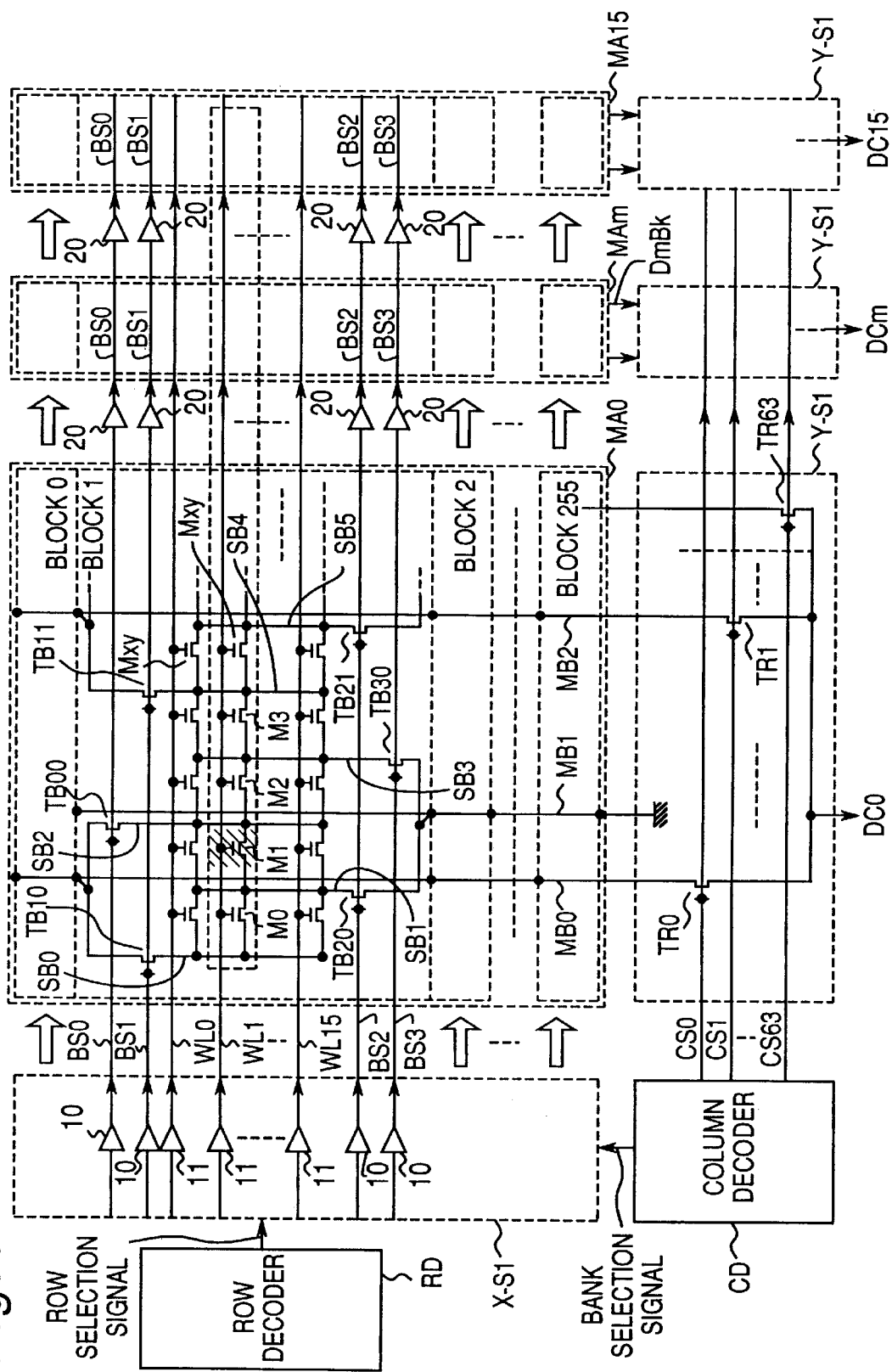
FIG. 1 is a circuit diagram of an essential part of a semiconductor storage device according to a first embodiment of the present invention.

FIG. 1 is a circuit diagram of a semiconductor storage device according to a first embodiment of the present invention. The semiconductor storage device has the same construction as that of the conventional read-only semiconductor storage device shown in FIGS. 8 and 9, except a bank selection line driving circuits and parts relating thereto. Parts of the semiconductor storage device same as those in FIGS.

Figure 8:
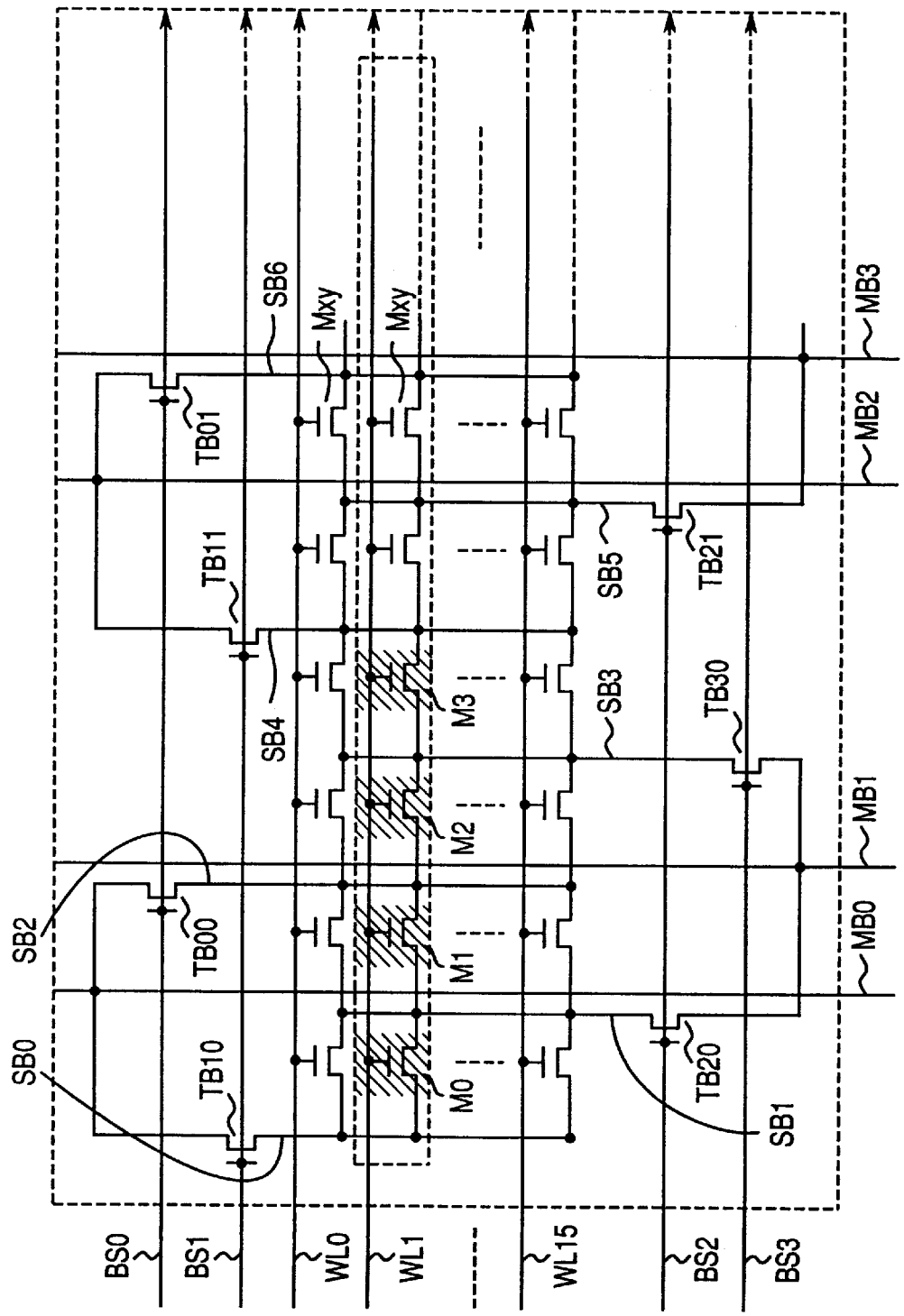
FIG. 8 is a circuit diagram showing the construction of a bank in a conventional semiconductor storage device employing the hierarchical bit lining method.
Figure 9:
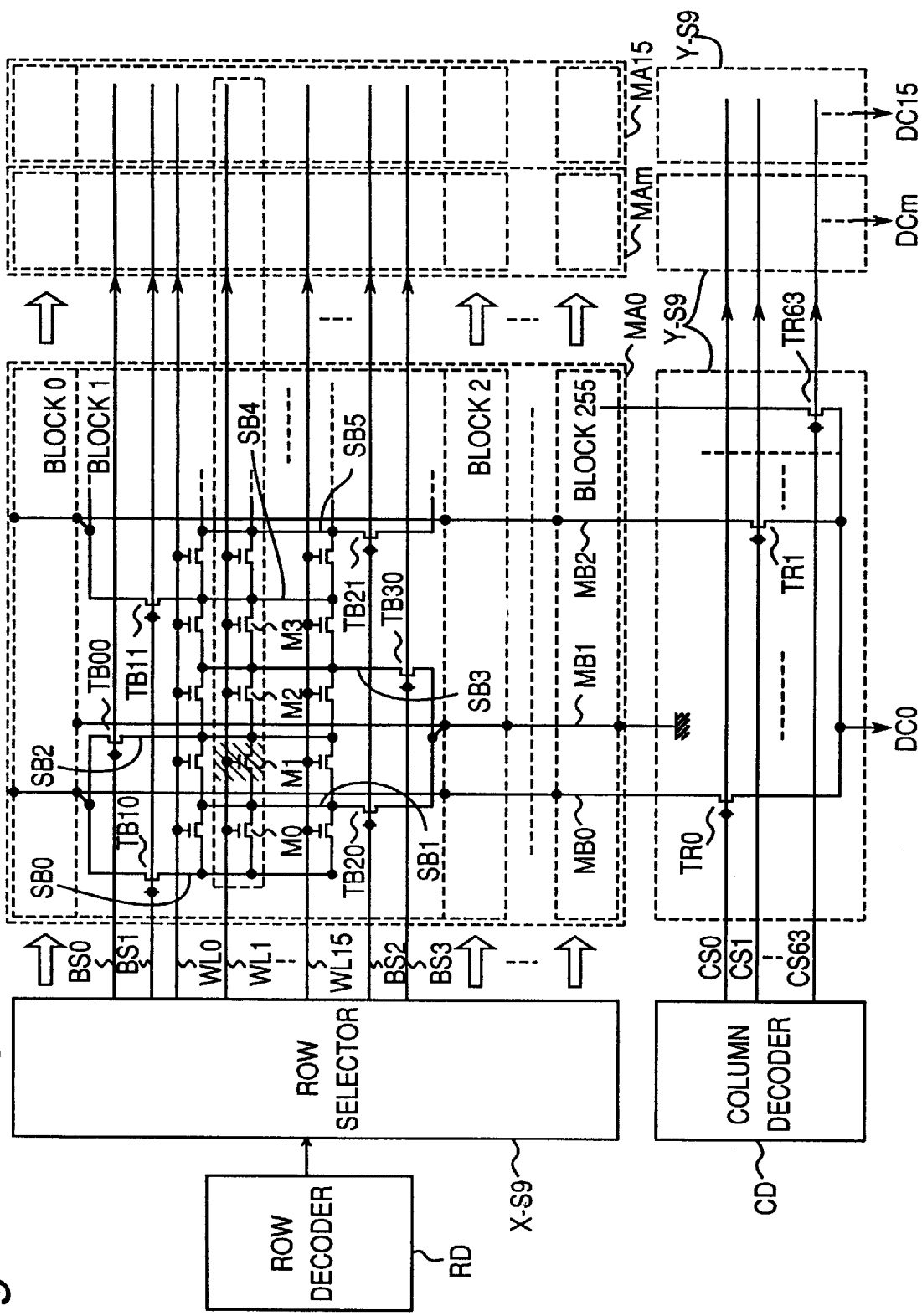
FIG. 9 is a circuit diagram of the conventional semiconductor storage device employing the hierarchical bit lining method.

8 and 9 are denoted by the same reference numerals as those of FIGS. 8 and 9.

As shown in FIG. 1, the semiconductor storage device has a plurality of memory cells Mxy (x=0–4095, y=0–255) of NOR type arranged in a matrix shape on a semiconductor substrate. The semiconductor storage device has a plurality of memory cell arrays MA0, . . . , MAm, . . . , and MA15 arranged in the row direction (lateral direction in FIG. 1); and a plurality of word lines WLi (i=0–4095) extending in the row direction and connected with the memory cells of each row of the memory cell arrays MA0, . . . , MAm, . . . , and MA15. Each of the memory cell arrays MA0, . . . , MAm, . . . , and MA15 is composed of blocks 0–255 arranged in the column direction (vertical direction in FIG. 1). Each block includes 16 word lines WLi. The blocks 0–255 have the same construction. Thus, the construction of the block 1 will be described below.

Sub-bit lines SB0, SB1, . . . extending in the column direction are connected with common sources or drains of the memory cells Mxy arranged in the column direction inside the block 1. These memory cells arranged in the column direction between the adjacent bit lines SB0 and SB1 constitute a bank. Similarly, memory cells arranged between the adjacent bit lines SB1 and SB2, SB2 and SB3, . . . constitute banks. These banks are arranged in the row direction. Main bit lines MB0, MB1, . . . forming the hierarchical structure together with the sub-bit lines SB0, SB1, . . . also extend in the column direction. The main bit lines MB0, MB1, . . . are wired through the blocks 0–255. The sub-bit line SB0 is connected with the main bit line MB0 through a bank selection transistor TB10, and the sub-bit line SB1 is connected with the main bit line MB1 through a bank selection transistor TB20. The sub-bit line SB2 is connected with the main bit line MB0 through a bank selection transistor TB00, and the sub-bit line SB3 is connected with the main bit line MB1 through a bank selection transistor TB30. In this manner, each two of the alternate sub-bit lines starting from the first one on the left-hand side of FIG. 1 (hereinafter, referred to as "odd sub-bit lines") are connected with the associated one of the alternate main bit lines starting from the first one (hereinafter, referred to as "odd main bit lines") through the associated bank selection transistors. Similarly, each two of the other alternate sub-bit lines starting from the second on the left-hand side of the figure (referred to as "even sub-bit lines") are connected with the associated one of the other alternate main bit lines starting from the second (referred to as "even main bit lines") through the associated bank selection transistors.

A bank selection line BS0 connected with the gate of each of the bank selection transistors TB00, . . . extends in parallel with the word lines WLi, and a bank selection line BS1 connected with the gate of each of the bank selection transistors TB10, TB11, . . . also extends in parallel with the word lines WLi. A bank selection line BS2 connected with the gate of each of the bank selection transistors TB20, TB21, . . . extends in parallel with the word lines WLi, and a bank selection line BS3 connected with the gate of each of the bank selection transistors TB30, . . . also extends in parallel with the word lines WLi. Similarly, the bank selection lines BS0–BS3 are connected with gates of the other bank selection transistors connecting the sub-bit lines with the corresponding main bit lines. For example, when a memory cell M1 is to be selected from among the memory cells M0, M1, M2, and M3 of the word line WL1, the electric potential of the word line WL1 connected with the memory cell M1 is set to "high" level and also, the electric potential of each of the bank selection lines BS0 and BS2 connected with the gate of each of the bank selection transistors TB00 and TB20 is set to "high" level, based on the predetermined addresses. That is, the bank selection transistor TB00 is turned on to thereby connect the sub-bit line SB2 with the main bit line MB0, and the bank selection transistor TB20 is turned on to thereby connect the sub-bit line SB1 with the main bit line MB1. In this manner, one of the bank selection lines BS0 or BS1 and one of the bank selection lines BS2 or BS3 are made active to divide the memory cells M0, M1, . . . connected with the same word line WL1 into four groups so that one of the four memory cell groups is selected.

The sub-bit lines SB0, SB1, . . . are composed of a diffusion layer in a semiconductor substrate. The main bit lines MB0, MB1, . . . are composed of a low-resistance metal. The word lines WLi and the bank selection lines BS0–BS3 are made of polysilicon.

The semiconductor storage device further has a row decoder RD for outputting a row selection signal upon receipt of a row address signal (A8–A19) through an unshown address buffer, and a row selector X-S1 for selecting one of the word lines WLi upon receipt of the row selection signal from the row decoder RD. The row selector X-S1 has word line driving circuits 11, 11, . . . whose output terminals are connected with one end of each of the word lines WLi for outputting a word line signal to select a group of the memory cells arranged in one row in the memory cell arrays MA0, . . . , MAm, . . . and MA15, and bank selection line driving circuits 10, 10, . . . whose output terminals are connected with one end of each of the bank selection lines BS0–BS3 for outputting a bank selection line signal to turn on and off the bank selection transistors TB00, TB10, . . . . The row selector X-S1 has further word line driving circuits 11, 11, . . . and bank selection line driving circuits 10, 10, . . . corresponding to a respective one of the blocks other than the block 1. The semiconductor storage device also has bank selection line driving circuits 20, 20, . . . arranged between the adjacent memory cell arrays MA0, . . . , MAm, . . . , and MA15 to assist the driving performance of the bank selection lines BS0–BS3. That is, each of the bank selection lines BS0–BS3 is connected with the bank selection line driving circuits 10 and 20, 20, . . . in series. Each of the bank selection line driving circuits 10 and 20 is composed of a two-stage inverter.

Figure 1A:
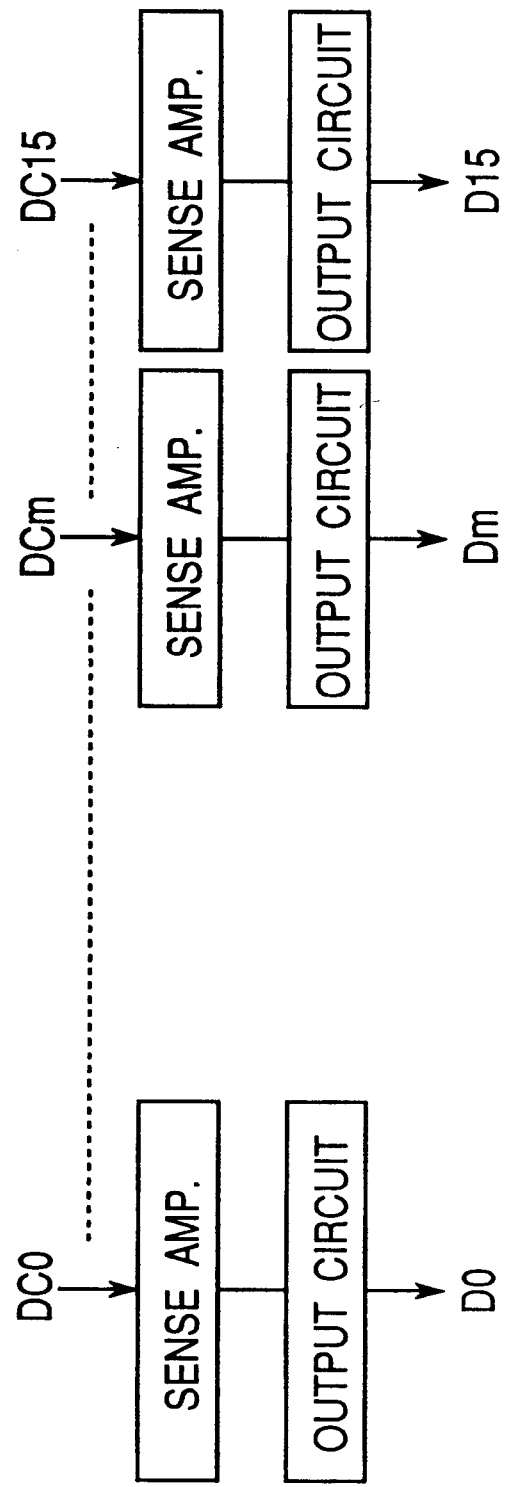
FIG. 1A is a block diagram of another part of the semiconductor storage device of FIG. 1.

The semiconductor storage device further has a column decoder CD for outputting a column selection line signal to column selection lines CS0–CS63 upon receipt of a column address signal (A0–A7) through an unshown address buffer, and column selectors Y-S1 each for selecting one of the odd main bit lines MB0, MB2, . . . by means of one of the column selection lines CS0–CS63 selected by the column decoder CD. Each of the column selectors Y-S1 includes column selection transistors TR0–TR63 whose bases are connected with the column selection lines CS0–CS63, respectively. The main bit lines MB0, MB2, . . . are connected with an input terminal of a sense amplifier shown in FIG. 1A through the column selection transistors TR0–TR63. Based on the column selection line signal transmitted to one of the column selection lines CS0–CS63, one of the column selection transistors TR0–TR63 is turned on to connect one of the main bit lines MB0, MB2, . . . with the input terminal of the sense amplifier. On the other hand, the even main bit lines MB1, . . . are grounded to be set at the ground potential as reference potential. The column decoder CD outputs a bank selection signal to the row selector X-S1. Based on the bank selection signal, the bank selection line driving circuits 10, 20, 20, . . . of the row selector X-S1 drive the associated bank selection line BS0, BS1, BS2, or BS3.

FIG. 2 is a timing chart showing the serial access mode operation of the semiconductor storage device.

The operation of the semiconductor storage device in reading the data of 256 words per page is described below.

When the address signals (A0–A19) have become definite at a time t0, the row address signal (A8–A19) shown in FIG. 2 (a) becomes definite at a time t1. Based on this definite row address signal and by means of the row decoder RD and the row selector X-S1, the level of the word line signal shown in FIG. 2 (c) of one of the word lines WLi gradually becomes "High", and becomes definite at a time t2. Also, based on the column address signal (A0–A7) shown in FIG. 2 (b) which has become definite at time t1 simultaneously with the row address signal (A8–A19), the level of each bank selection line signal shown in FIG. 2 (d)–(g) of the bank selection lines BS0–BS3 becomes definite at the time t1. More specifically, the level of the bank selection line signal of each of the bank selection lines BS1 and BS2 becomes "High", and the level of the bank selection line signal of each of the bank selection lines BS0 and BS3 becomes "Low". As a result, the memory cell M0 corresponding to word data W0 is selected. Then, at a time t3, the level of a signal indicating the information of the memory cell M0 on each of the main bit lines MB0 and MB1 becomes definite, so that data DmB0 (m=0–15), shown in FIG. 2 (h), of the main bit line MB0 becomes definite. Furthermore, based on the column address signal (A0–A7), the level of the column selection line signal, shown in FIG. 2(l), of the column selection line CS0 is made "High" by the column decoder CD at the time T1, so that the column selection transistor TR0 is turned on. Then, at a time t4, the level of an output signal Dm (m=0–15), shown in FIG. 2 (m), based on the main bit lines MB0 and MB1 becomes definite.

When only the column address signal (A0–A7) changes at a time t5 as shown in FIG. 2 (a), the bank selection line signal of each of the bank selection lines BS0 and BS2 assumes a "High" level, and the bank selection line signal of each of the bank selection lines BS1 and BS3 assumes a "Low" level. As a result, the memory cell M1 corresponding to the word data W1 is selected because the word line is already definite, and the level of the signal of each of the main bit lines MB0 and MB1 becomes definite. At a time t6, data DmB1 (m=0–15) shown in FIG. 2 (i) of the main bit line MB0 becomes definite. When the level of the column selection line signal (shown in FIG. 2 (l)) of the column selection line CS0 becomes "High" at a time t7, the column selection transistor TR0 is turned on, and the level of an output signal Dm based on the main bit lines MB0 and MB1 becomes definite.

For word data W2 and the subsequent word data also, while switching the bank selection line signal and the column selection line signal, information of the memory cells Mxy connected with the same word line WLi is read successively, so that the page data DmBk (m=0–15, k=0–255) of page Ph is read out, as in the case of the word data W0 and W1.

When the row address signal (A8–A19) has changed to change page Ph to the next page (Ph+1), a reading operation similar to that for page Ph is executed after the word line WLi changes.

As described above, in the semiconductor storage device having the hierarchical bit line structure and executing the serial access operation, when the row address signal (A8–A19) does not change, and only the column address signal (A0–A7) changes, i.e., when word data for one page are read sequentially, the bank selection lines BS0–BS3 are switched from one to another. At this time, the bank selection line driving circuits 10, 10, . . . ; 20, 20, . . . ; 20, 20, . . . ; . . . drive the associated bank selection lines BS0–BS3 for the respective memory cell arrays MA0, . . . , MAm, . . . , and MA15. Accordingly, each of the bank selection line driving circuits 10, 10, . . . , and 20, 20, . . . is subject to only a small load. This allows the transition time (i.e., a time required for the change from an active state to an inactive state and vice versa) of the bank selection line signals from the bank selection line driving circuits 10, 10, . . . , and 20, 20, . . . to be shorter than that of the word line signals from the word line driving circuits 11, . . . . The number of the bank selection lines BS0–BS3 is much smaller than that of the word lines WLi, and the total area occupied by the bank selection line driving circuits 10, 10, . . . and 20, 20, . . . is comparatively small. Therefore, increase of the planar dimensions of the chip due to the provision of the bank selection lines and the bank selection line driving circuits is suppressed.

Accordingly, even though the number of memory cells successively readable by the serial access operation of the semiconductor storage device is increased, i.e., even though the word length is made loner, it is possible to suppress the increase of the area of the chip and allow the average access time to be short. Further, when the number of memory cells is not increased, the semiconductor storage device has a shorter average access time than the conventional one.

In the semiconductor storage device, the change in the level of the bank selection line signal on the bank selection lines BS0–BS3 in each of tends to delay as the distance from the row selector X-S1 becomes longer. In order to cope with such a delay, the memory cell arrays MA0, . . . , MAm, . . . , and MA15 are arranged in such a manner that the bits of respective output signals D0–D15 are transferred serially from the output signal D0. In this manner, the output signals D0–D15 are not adversely affected. In such a construction, instantaneous electric current can be prevented from flowing through the bank selection line driving circuits 10, 10, . . . , and 20, 20, . . . simultaneously, resulting in the reduced instantaneous electric current during the serial access operation of the semiconductor storage device. Therefore, the serial access operation of the semiconductor storage device is stabilized.

Second Embodiment

Figure 3:
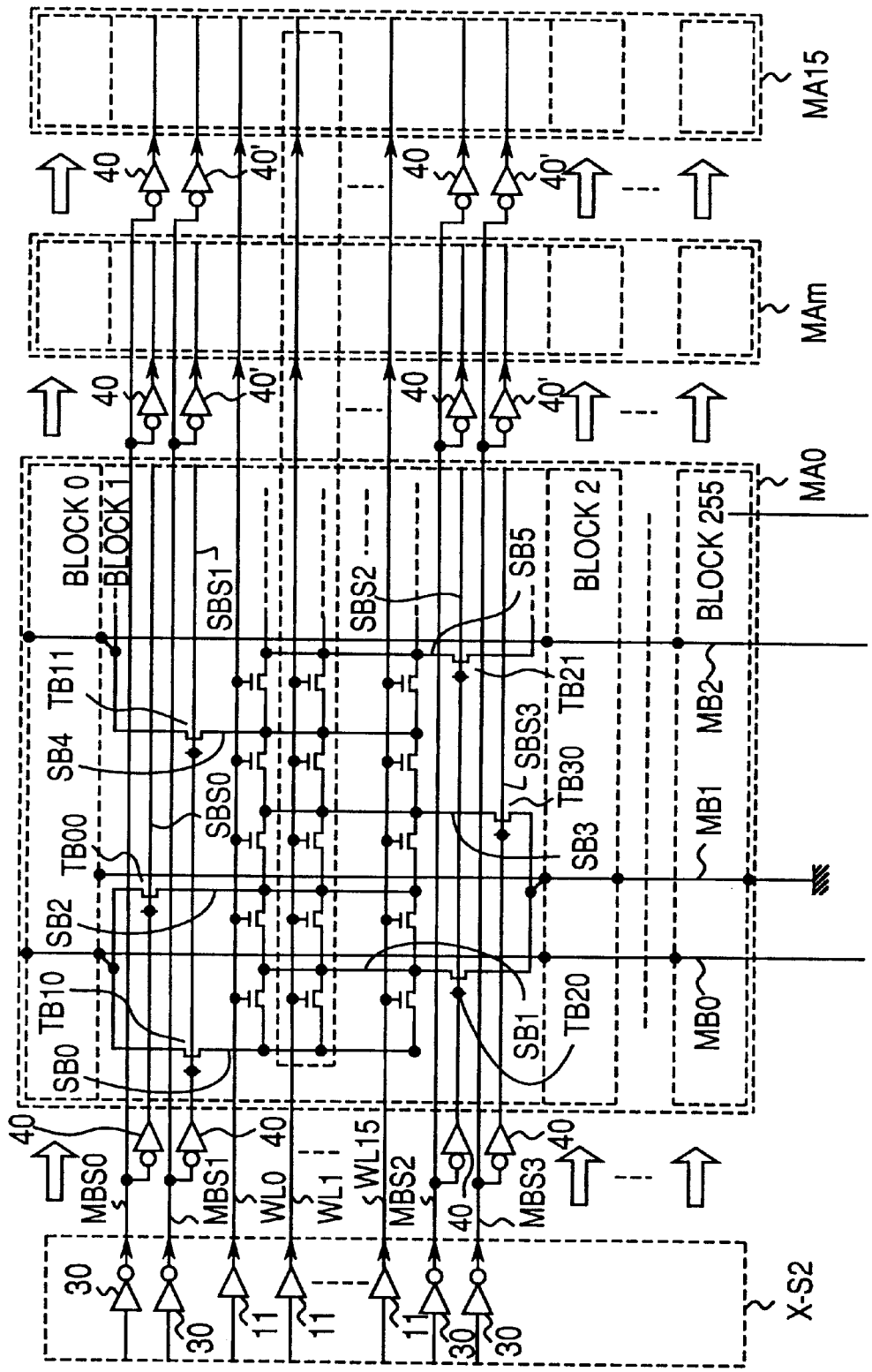
FIG. 3 is a circuit diagram of an essential part of a semiconductor storage device according to a second embodiment of the present invention.

FIG. 3 is a circuit diagram of an essential part of a semiconductor storage device according to a second embodiment of the present invention. The semiconductor storage device has the same construction as that of the read-only semiconductor storage device of the first embodiment, except for a row selector, bank selection lines and bank selection line driving circuits. Thus, parts of the second embodiment same as those of the first embodiment are denoted by the same reference numerals as those of the first embodiment, and the descriptions thereof are omitted herein.

As shown in FIG. 3, four bank selection line driving circuits 40, 40, . . . whose output polarities are inverse to input polarities are provided between the adjacent memory cell arrays MA0, . . . , MAm, and MA15 arranged in the row direction. Further, four bank selection line driving circuits 40, 40, . . . whose output polarities are inverse to input polarities are provided between a row selector X-S2 and the first memory cell array MA0. The bank selection line driving circuits 40, 40, . . . in groups drive sub-bank selection lines SBS0–SBS3 provided in the respective memory cell arrays MA0, . . . , MAm, . . . , and MA15. The row selector X-S2 has main bank selection line driving circuits 30, 30, . . . whose output polarities are inverse to input polarities. The output terminal of each of the main bank selection line driving circuits 30, 30, . . . is connected with one end of each of main bank selection lines MBS0–MBS3 arranged in parallel with the word lines WLi. The main bank selection lines MBS0–MBS3 are connected with the input terminal of each of the bank selection line driving circuits 40, 40, . . . . Based on the output of the main bank selection line driving circuits 30, 30, . . . , the bank selection line driving circuits 40, 40, . . . drive the sub-bank selection lines SBS0–SBS3 in the respective memory cell arrays MA0, MA1, . . . .

Because the bank selection line driving circuits 40, 40, . . . for each of the memory cell arrays MA0, . . . , MAm, and MA15 drive the sub-bank selection lines SBS0–SBS3 of the respective memory cell arrays, a load on each of the bank selection line driving circuits 40, 40, . . . is so small that the transition time of the bank selection line signals from the main bank selection line driving circuits 30, 30, . . . and bank selection line driving circuits 40, 40, . . . is made shorter than that of the word line signals from the word line driving circuits 11, 11, . . . . Accordingly, even though the number of memory cells to be serially accessed is increased, it is possible to reduce the average access time while suppressing the increase of the total chip area.

Furthermore, because each of the main bank selection line driving circuits 30, 30, . . . and the bank selection line driving circuits 40, 40, . . . can be composed of a one-stage inverter, it is possible to reduce the area of those driving circuits relative to the entire chip area.

Third Embodiment

Figure 4:
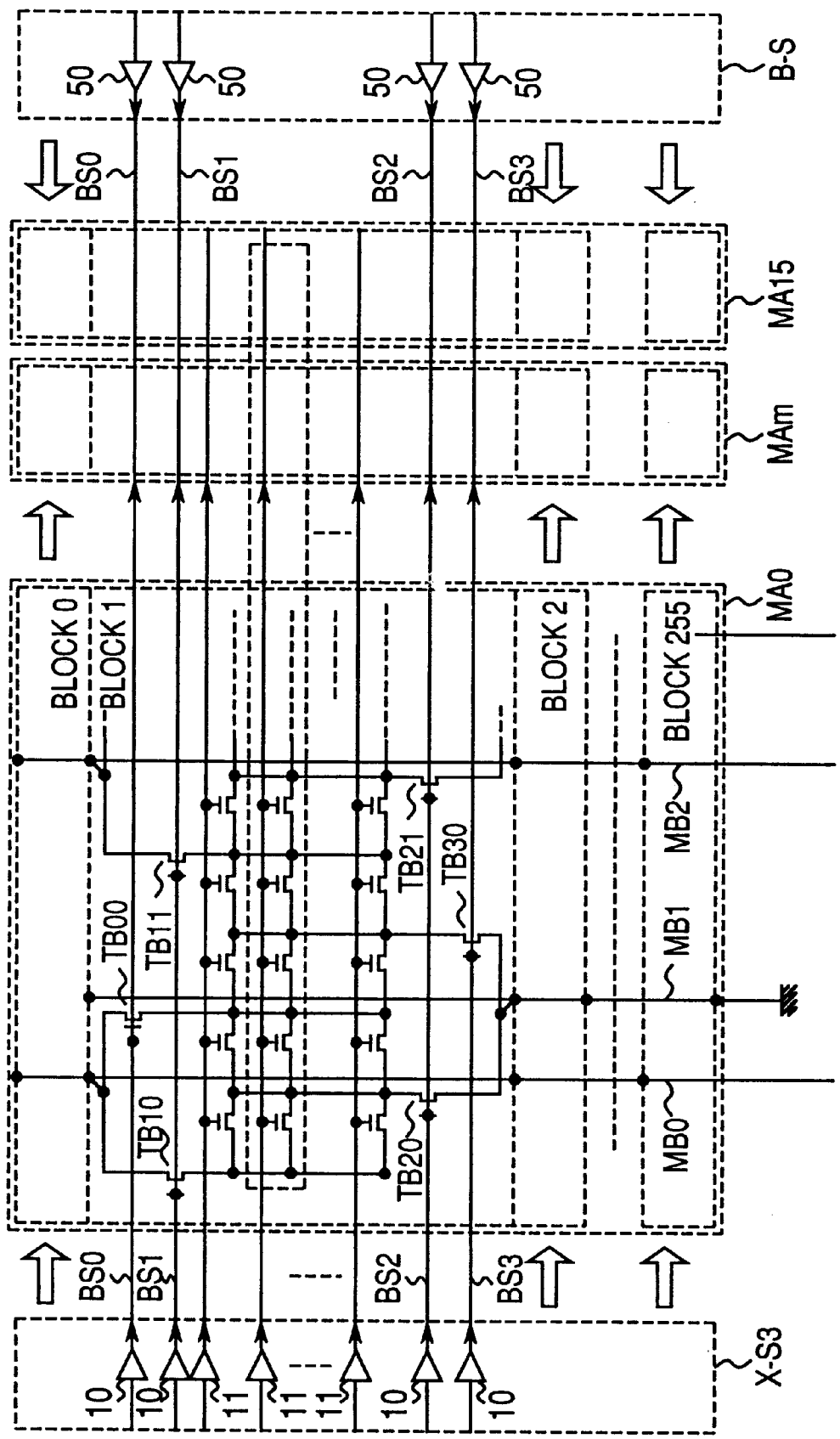
FIG. 4 is a circuit diagram of an essential part of a semiconductor storage device according to a third embodiment of the present invention.

FIG. 4 is a circuit diagram of an essential part of a semiconductor storage device according to a third embodiment of the present invention. This semiconductor storage device has the same construction as that of the semiconductor storage device of the first embodiment, except bank selection lines and bank selection line driving circuits. Thus, parts of the third embodiment same as those of the first embodiment are denoted by the same reference numerals as those of the first embodiment, and the descriptions thereof are omitted herein.

The semiconductor storage device has a row selector X-S3 having the same construction as that of the row selector X-S1 of the first embodiment shown in FIG. 1. The device also has a bank selector B-S having bank selection line driving circuits 50, 50, . . . whose output terminals are connected with bank selection lines BS0–BS3, respectively. The bank selector B-S is positioned at a side opposite from the row selector X-S3 with respect to the memory cell arrays MA0, . . . , MAm, and MA15. Bank selection lines BS0–BS3 are driven simultaneously from both ends thereof by both the bank selection line driving circuits 10, 10, . . . in the row selector X-S3 and the bank selection line driving circuits 50, 50, . . . in the bank selector B-S.

Accordingly, the transition time of the bank selection line signals of the bank selection line driving circuits 10, 10, and bank selection line driving circuits 50, 50, . . . is allowed to be shorter than that of the word line signals of the word line driving circuits 11, 11, . . . . Thus, even though the number of the serially accessible memory cells is increased, it is possible to allow the average access time to be short and yet suppress the increase of the area of the chip. Moreover, because the row selector X-S3 and the bank selector B-S can be positioned outside the memory cell arrays MA0, . . . , MAm, and MA15, it is unnecessary to form a gap or space between the adjacent memory cell arrays MA0, . . . , MAm, and MA15. This eliminates the increase of the area of the memory cell arrays MA0, . . . , MAm, and MA15 themselves. Accordingly, it is easy to efficiently arrange the parts.

Fourth Embodiment

Figure 5:
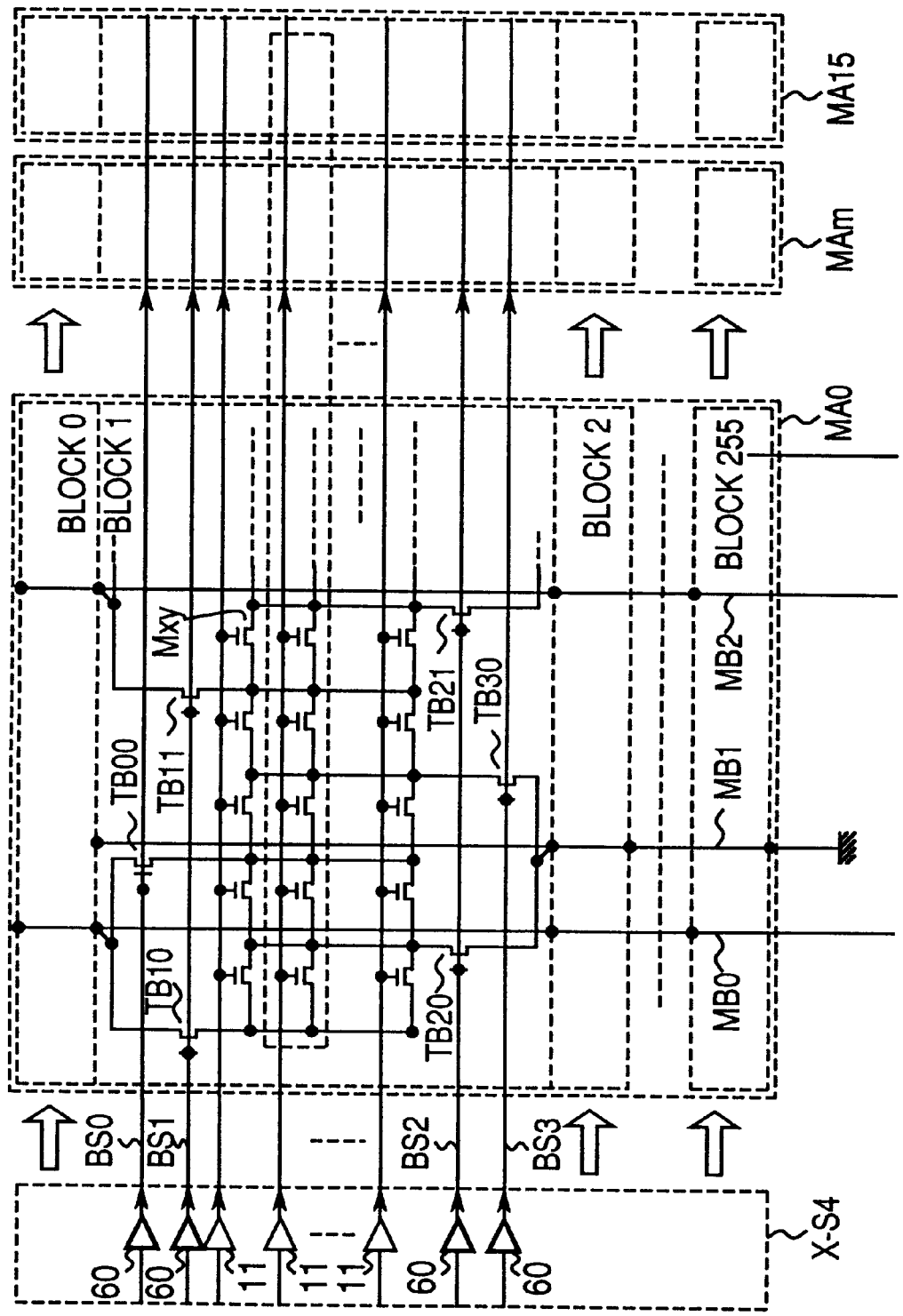
FIG. 5 is a circuit diagram of an essential part of a semiconductor storage device according to a fourth embodiment of the present invention.
Figure 6:
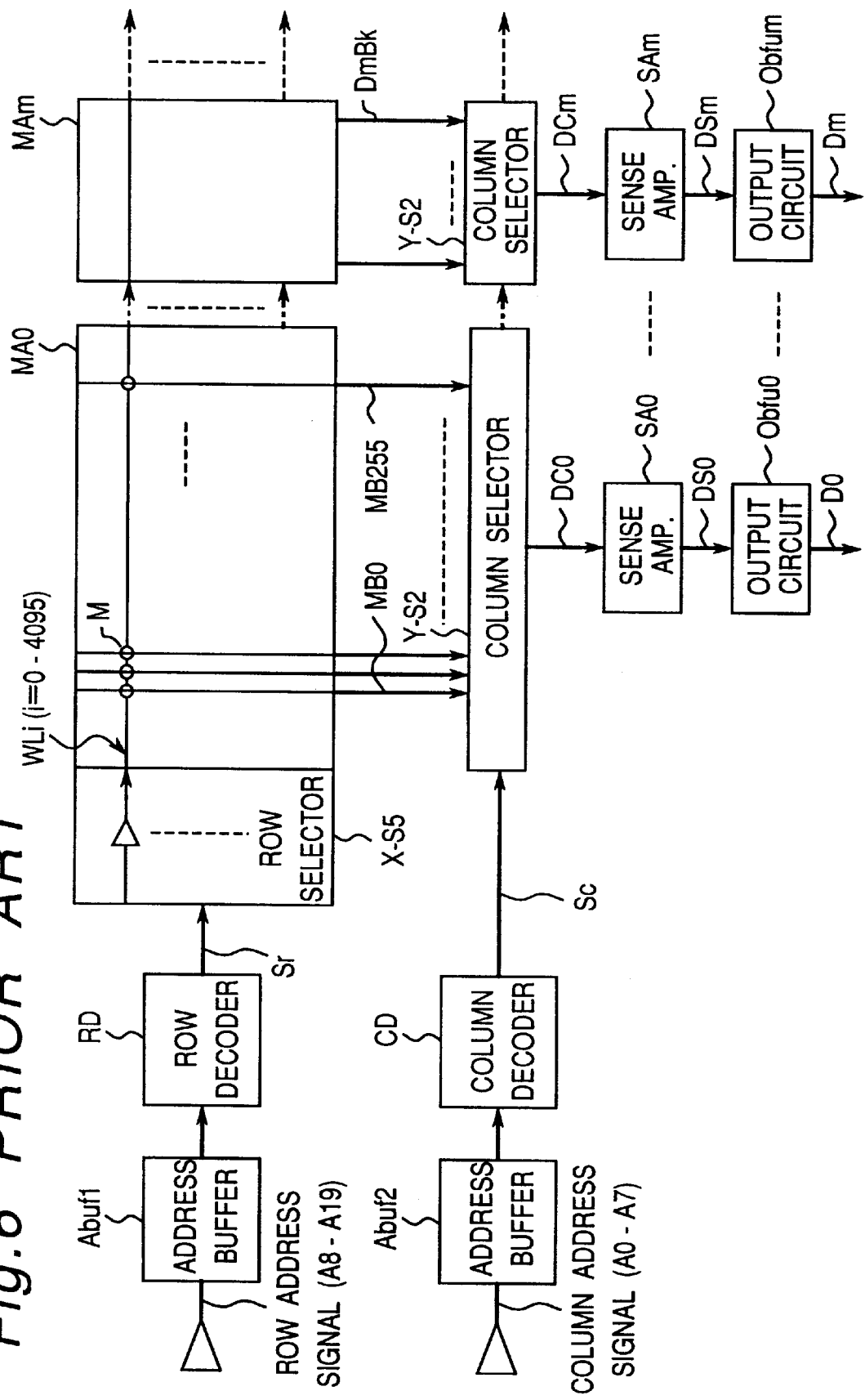
FIG. 6 is a block diagram showing a serial access operation of a conventional semiconductor storage device.
Figure 7:
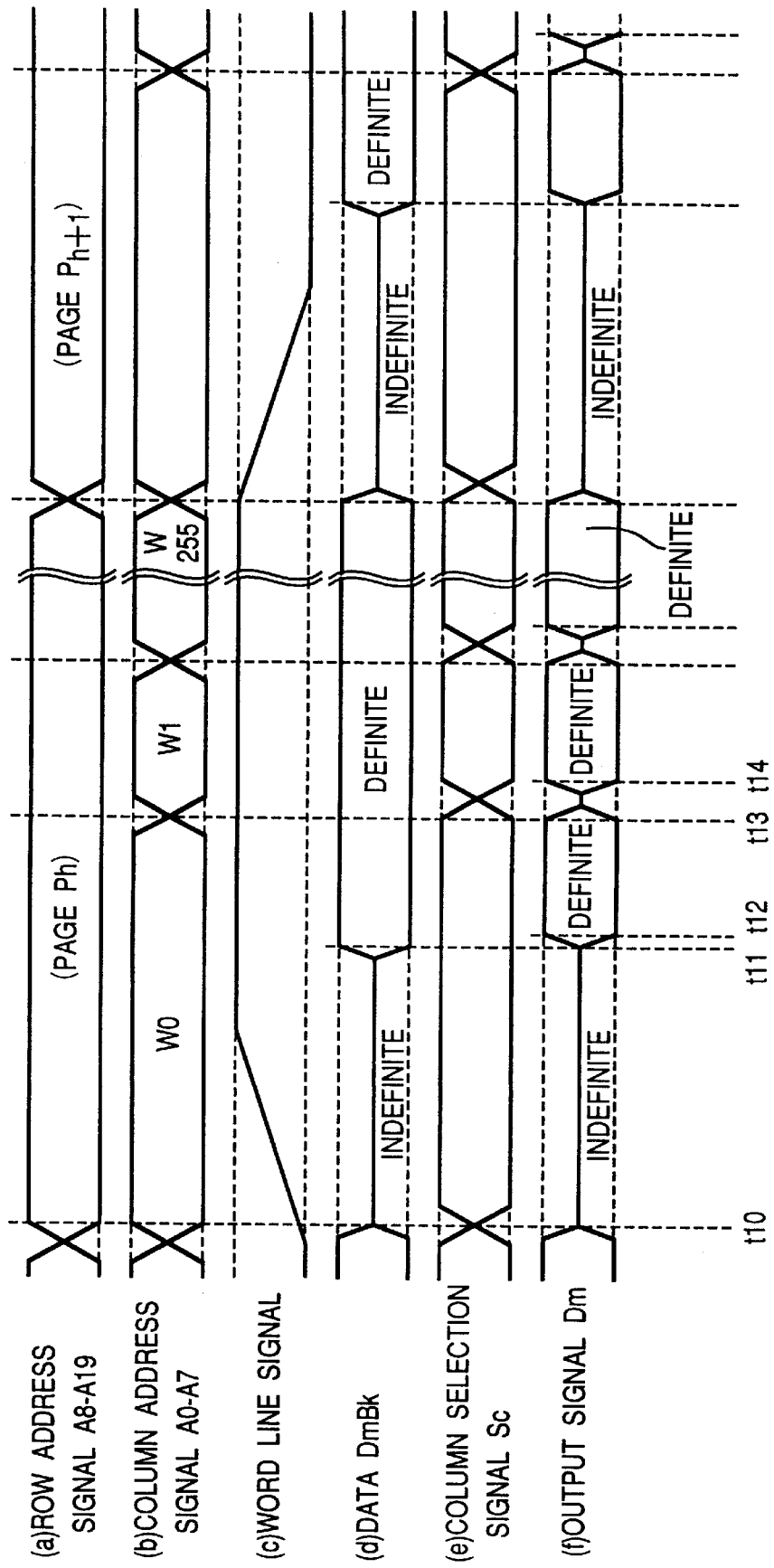
FIG. 7 is a timing chart showing the serial access operation of the conventional semiconductor storage device.

FIG. 5 is a circuit diagram of an essential part of a semiconductor storage device according to a fourth embodiment of the present invention. This semiconductor storage device has the same construction as that of the conventional semiconductor storage device shown in FIG. 9, except for a row selector having bank selection line driving circuits. Thus, parts of the fourth embodiment same as those of the conventional semiconductor storage device are denoted by the same reference numerals as those of the conventional semiconductor storage device, and the descriptions thereof are omitted herein.

The semiconductor storage device has a row selector X-S4 having bank selection line driving circuits 60, 60, . . . and word line driving circuits 11, 11, . . . , as shown in FIG. 5. The bank selection line driving circuits 60, 60, . . . have a greater driving power than the word line driving circuits 11, 11, . . . .

Accordingly, the transition time of the bank selection line signals from the bank selection line driving circuits 60, 60, . . . is allowed to be shorter than that of the word line signals from the word line driving circuits 11, 11, . . . . Thus, even though the number of memory cells serially accessible is increased, it is possible to reduce the average access time while suppressing the increase of the area of the chip. Because the bank selection line driving circuits 60, 60, . . . have an increased driving power, the bank selection line driving circuits 60, 60, . . . require an increased area. But the bank selection line driving circuits 60, 60, . . . are considerably smaller in number than the word line driving circuits 11, 11, . . . . Therefore, it is possible to suppress the increase of the area of the chip to a minimum.

In the first through fourth embodiments, the present invention is applied to the read-only semiconductor storage device, although the present invention is applicable to a read/write semiconductor storage device.

In the first through fourth embodiments, the semiconductor storage device of NOR type has been described, but the present invention is applicable to a NAND type semiconductor storage device having a hierarchical bit line structure.

Needless to say, the number of the memory cell arrays and the manner of arranging the memory cells are not restricted to those described in the first through fourth embodiments.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device comprising:
   one or more memory cell arrays each consisting of a plurality of memory cells arranged in a matrix shape;
   a plurality of word lines extending in a direction of rows of said one or each memory cell array and connected with the memory cells in each row;
   a plurality of main bit lines and sub-bit lines in a hierarchical structure which extend in a direction of columns of said one or each memory cell array, wherein said memory cells in columns are connected with said sub-bit lines and each sub-bit line is connected with one of said main bit lines such that said memory cells in columns are connected with said main bit lines through said sub-bit lines;

column selection means connected with said main bit lines in said one or each memory cell array for sequentially selecting the main bit lines;

a plurality of bank selection lines for selecting the sub-bit lines connected with the sequentially selected main bit lines, said bank selection lines extending parallel with said word lines;

word line driving means for outputting a word line signal to drive the word lines; and bank selection line driving means for outputting a bank selection line signal to drive the bank selection lines, wherein one of said word lines is selected by the word line signal output from the word line driving means, and in said one or each memory cell array, the memory cells connected with the selected word line are serially accessed through sequential selection, by the bank selection line signal output from the bank selection line driving means, of the sub-bit lines connected with the sequentially selected main bit lines, and wherein a transition time of the bank selection line signal output from said bank selection line driving means is shorter than that of the word line signal output from said word line driving means.

2. The semiconductor storage device according to claim 1, wherein said memory cell arrays are arranged in the row direction, and said bank selection line driving means are provided in one-to-one correspondence with the respective memory cell arrays.

3. The semiconductor storage device according to claim 2, wherein said bank selection line driving means and the bank selection lines of said memory cell arrays are connected in series.

4. The semiconductor storage device according to claim 2, further comprising second bank selection line driving means whose output terminal is connected with input terminals of said bank selection line driving means for the respective memory cell arrays.

5. The semiconductor storage device according to claim 4, wherein an output of said bank selection line driving means has a polarity inverse to that of an input thereof, and an output of said second bank selection line driving means also has a polarity inverse to that of an input thereof.

6. The semiconductor storage device according to claim 1, wherein when the device has the plural memory cell arrays, these memory cell arrays share each bank selection line, and wherein said bank selection line driving means is provided on both sides of said one or more memory cell arrays such that both ends of each bank selection line are connected with an output terminal of each bank selection line driving means.

7. The semiconductor storage device according to claim 1, wherein the memory cells in said one or each memory cell array are divided into a plurality of blocks in the column direction, said blocks share said main bit lines, and each block has said sub-bit lines and said bank selection lines, independently of the other blocks.

* * * * *

UNITED STATES PATENT AND TRADEMARK OFFICE
CERTIFICATE OF CORRECTION

PATENT NO. : 5,926,432
DATED : July 20, 1999
INVENTOR(S) : Kawai et al.

It is certified that error appears in the above-identified patent and that said Letters Patent is hereby corrected as shown below:

Column 1, line 59, "Abufl" should be --Abufl--.

Column 2, line 36, "line s" should be --lines--.

Column 2, line 53, "mnode" should be --mode--.

Column 4, line 44, "use d" should be --used--.

Column 5, line 46, "out put" should be --output--.

Column 11, line 16, "MAm, and" should be --MAm,..., and--.

Signed and Sealed this

Eleventh Day of July, 2000

Attest:

Q. TODD DICKINSON

*Attesting Officer*                *Director of Patents and Trademarks*